United States Patent

Burns et al.

[15] 3,636,418

[45] Jan. 18, 1972

[54] EPITAXIAL SEMICONDUCTOR DEVICE HAVING ADHERENT BONDING PADS

[72] Inventors: Joseph Richard Burns, Trenton; Joseph Hurlong Scott, Newark, both of N.J.

[73] Assignee: RCA Corporation

[22] Filed: Aug. 6, 1969

[21] Appl. No.: 847,925

[52] U.S. Cl. ....................317/234 R, 317/235 R, 317/234 N, 317/234 S, 317/235 D, 317/101

[51] Int. Cl. ....................H01l 5/00

[58] Field of Search ....................317/234, 235, 101

[56] References Cited

UNITED STATES PATENTS

| | | | |
|---|---|---|---|
| 3,308,354 | 3/1967 | Tucker | 317/234 |
| 3,074,145 | 1/1963 | Rowe | 29/25.3 |
| 3,475,664 | 10/1969 | Vries | 317/235 |
| 3,304,595 | 2/1967 | Sato et al. | 29/25.3 |
| 3,377,513 | 4/1968 | Ashby et al. | 317/101 |
| 3,414,434 | 12/1968 | Manasevit | 117/201 |

*Primary Examiner*—John W. Huckert
*Assistant Examiner*—B. Estrin
*Attorney*—Glenn H. Bruestle

[57] ABSTRACT

A substrate of a dielectric material, e.g., sapphire, has a matrix of semiconductor components, e.g., diodes on a surface thereof. The components comprise a layer of a semiconductor material, e.g., silicon, including various doped regions. Connector strips are provided on the substrate for interconnecting the various components in rows and columns, and for connecting the components to bonding pads on the substrate. The bonding pads comprise a layer of the semiconductor material in direct contact with the substrate, and a layer of metal on top of the silicon layer. A layer of insulating material is optionally included between the semiconductors and metal layers.

8 Claims, 7 Drawing Figures

INVENTORS
Joseph R. Burns and
Joseph H. Scott.
BY M. Y. Epstein
ATTORNEY

INVENTORS.
Joseph R. Burns and
Joseph H. Scott.
BY M. Y. Epstein
ATTORNEY

EPITAXIAL SEMICONDUCTOR DEVICE HAVING ADHERENT BONDING PADS

BACKGROUND OF THE INVENTION

This invention relates to semiconductor devices.

Certain types of semiconductor devices comprise a substrate of a dielectric material, e.g., sapphire, having a plurality of semiconductor components on a surface thereof. The semiconductor components comprise a layer of a semiconductor material, e.g., silicon, including various doped regions, and a metal layer providing electrical connections to various ones of the doped regions. The metal layer also provides bonding pads to which various ones of the components are electrically connected. Fine wires are connected to the bonding pads, the wires being connected, in turn, to terminal means of an envelope in which the substrate is enclosed.

A problem associated with devices of the type described is that the bonding pads, generally comprising one or more layers of metal on the dielectric substrate, do not adhere well to the substrate, and tend to become loose during the bonding of the fine wires thereto. This results in loose and faulty electrical connections to the components, hence in inoperative devices.

SUMMARY OF THE INVENTION

A dielectric substrate has a semiconductor component thereon. A bonding pad is provided on the substrate and is electrically connected to the component. The bonding pad comprises a layer of a semiconductor material in direct contact with the substrate and a layer of metal on top of the semiconductor layer.

DESCRIPTION OF PREFERRED EMBODIMENTS

The present invention is described in connection with semiconductor devices of the type having utility in the memory systems of computers, such devices being known as read-only-memories.

Figure 1:
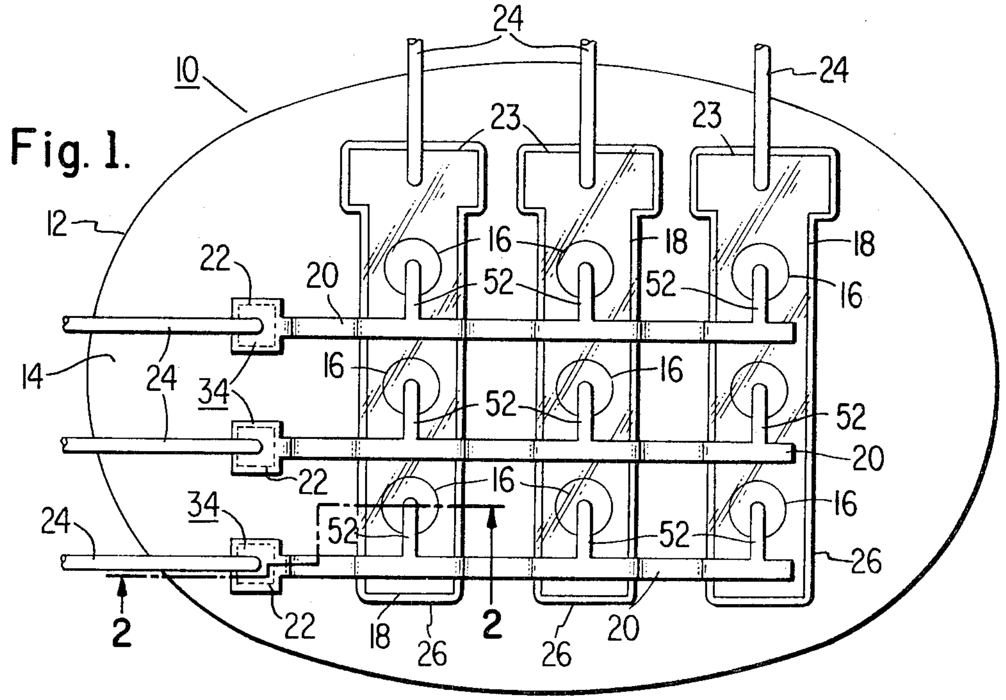
FIG. 1 is a plan view of a semiconductor device in accordance with one embodiment of the present invention.
Figure 2:
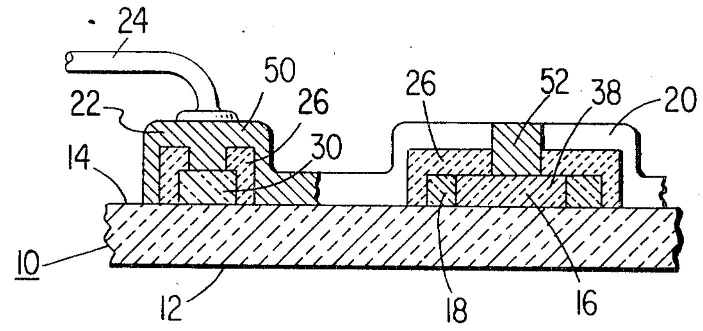
FIG. 2 is a section on an enlarged scale, along line 2—2 of FIG. 1.

With reference to FIGS. 1 and 2, a read-only-memory device 10 is shown which comprises a flat substrate 12 of a dielectric material, e.g., of sapphire, having, on one surface 14 thereof, a plurality of semiconductor diodes 16 arranged in rows and columns, two orthogonal sets of diode connecting strips 18 and 20, a plurality of bonding pads 22 and 23, and a plurality of fine wires 24 bonded one each to each pad. A layer 26 of insulating material is disposed between the two sets of connecting strips 18 and 20, openings being provided through the layer 26 through which electrical connections between the upper set of connectors 20 and various ones of the diodes 16 are made. Each diode 16 is integral with a strip 18, and is electrically connected to a strip 20.

The read-only-memory device 10 shown in FIGS. 1 and 2 is normally mounted within an envelope including terminal means which are connected to each of the fine wires 24. Envelopes suitable for this purpose are well known; accordingly, examples thereof are not described.

Further details of such devices, and uses thereof, are described in U.S. Pat. No. 3,377,513, issued to R. A. Ashby, et al., on Apr. 9, 1968. As noted in this patent, the substrate 12 can alternatively be any of several materials such as spinel, beryllium oxide or zirconium oxide.

The fabrication of the device 10 is as follows.

Figure 3:
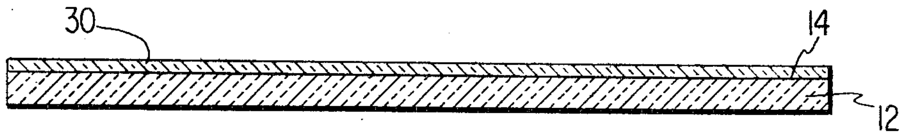
FIG. 3 is a sectional view of a workpiece substrate showing a step in the fabrication of the device shown in FIGS. 1 and 2.

Starting with a thin, flat substrate 12 of sapphire (FIG. 3), a thin layer 30 of a semiconductor material, e.g., silicon or germanium, is provided on a surface 14 of the substrate. The semiconductor material can be provided in known ways, e.g., by chemical deposition, by bonding a wafer of the semiconductor material to the substrate and then lapping, or the like. In the instant embodiment, the layer 30 comprises silicon of N-conductivity type, provided by a known epitaxial growth process.

Figure 4:
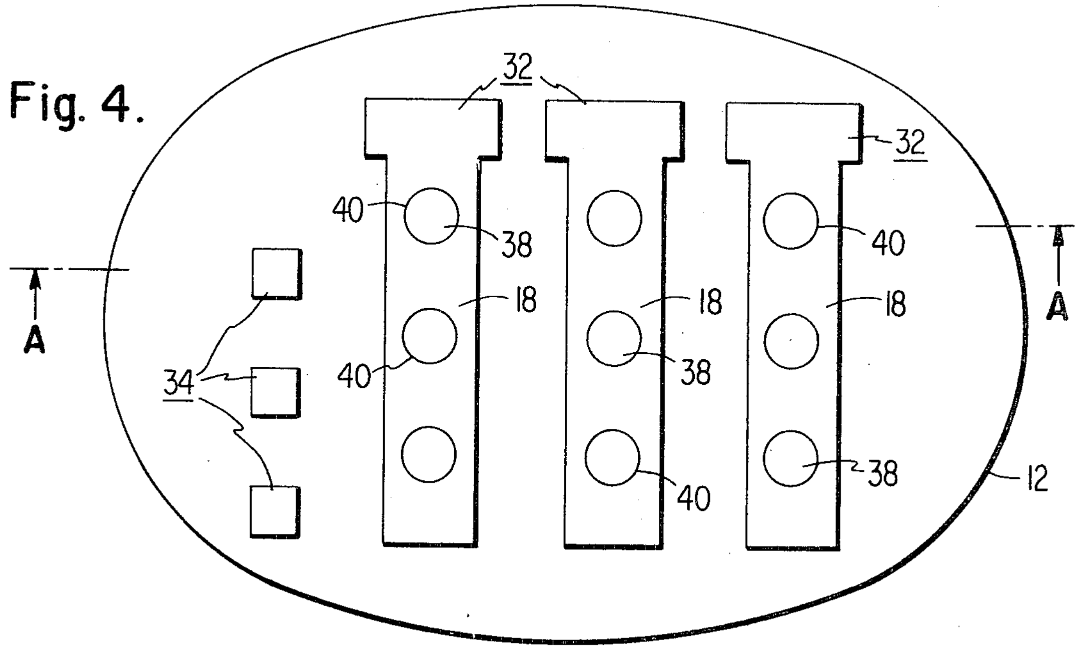
FIG. 4 is a plan view of the workpiece showing a subsequent step in the processing thereof.

Using standard masking and etching techniques, portions of the silicon layer 30 are then removed leaving a pattern (FIG. 4), formed of N-doped silicon, of spaced longitudinally extending strips 18 and two sets 32 and 34 of what are to become the bonding pads 23, and 22, respectively (FIG. 1). Each of the connector strips 18 is integral with a different one of the bonding pad elements 32.

Spaced, circular portions 38 of each strip 18 are then converted to P-conductivity type, using e.g., standard masking and doping techniques. This provides a plurality of PN-junctions 40 at spaced intervals along the strips 18.

Figure 5:
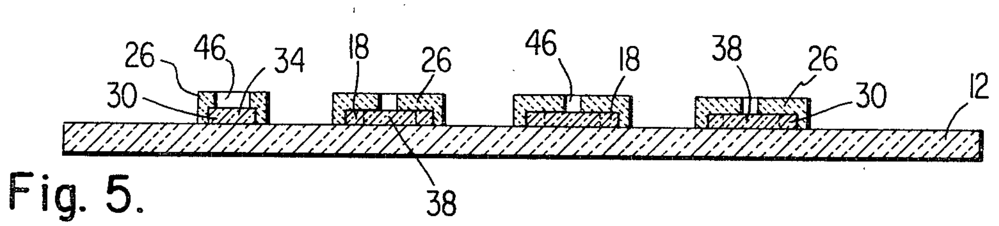
FIGS. 5 and 6 are central sections, looking in the direction of the arrows A of FIG. 4, of the workpiece showing still further steps in the processing thereof.

Thereafter, as illustrated in FIG. 5, the remaining portions of the silicon layer 30 are covered with a layer 26 of an insulating material of the type normally used in the fabrication of semiconductor devices, e.g., silicon dioxide or silicon nitride. A silicon dioxide layer can be provided, for example, by thermally converting a surface portion of the silicon layer to the oxide, in accordance with known processes. Openings 46 are then selectively etched through the layer 26 to expose surface portions of the P-type portions 38 of the strips 18 and surface portions of the bonding pad elements 32 and 34, the elements 32 not being visible in FIG. 5.

Figure 6:
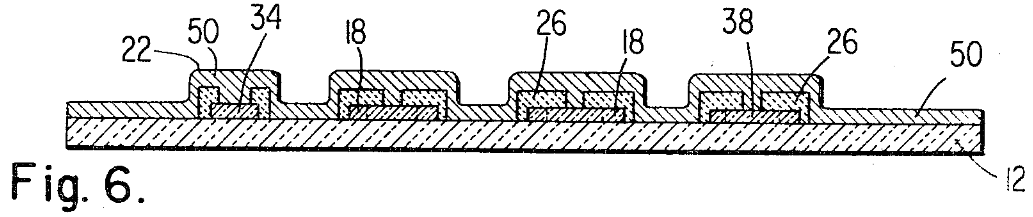

The entire surface of the workpiece is then coated (FIG. 6) with a layer 50 of metal, e.g., aluminum, titanium, nickel, or the like, deposited, e.g., by an evaporation process. Portions of the metal layer 50 extend through the openings 46 through the insulating layer 26 and cover the previously exposed surface portions 38 of the strips 18 and the bonding pad elements 32 and 34, now completed bonding pads 23 and 22, respectively.

Using known masking and etching techniques, portions of the metal layer 50 are then removed leaving a pattern (FIG. 1) of spaced laterally extending strips 20 each connected to a different one of the bonding pads 22. Also each strip 20 is connected to the P-doped portions 38 (FIG. 2) of different ones of the diodes 16 by narrow connector extensions 52.

Fine connecting wires 24 are then bonded, as by known ultrasonic bonding techniques, to each of the bonding pads 22 and 23.

As described, each of the bonding pads 22 and 23 comprises a layer 30 (FIG. 2) of silicon directly engaged with the substrate 12 and a layer 50 of metal engaged with the silicon layer. In the prior art, the bonding pads comprise one or more layers of metal directly engaged with the substrate. An advantage of the herein described arrangement is that the adherence of the metal layer of the bonding pads to the substrate is, as compared with the prior art, greatly increased. Thus, upon the bonding of the terminal wires 24 to the bonding pads 22 and 23, peeling of the metal layers 50 is greatly reduced.

Figure 7:
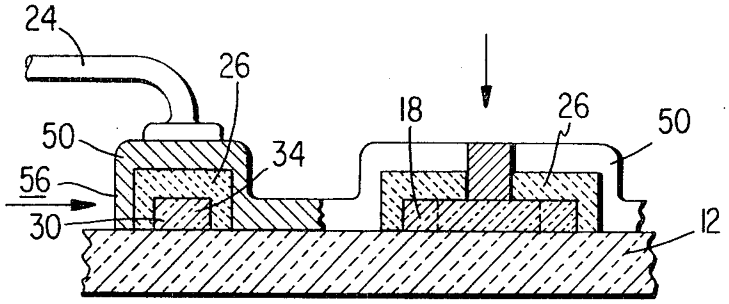
FIG. 7 is a sectional view similar to that of FIG. 2, but showing a different embodiment of the invention.

In another embodiment, shown in FIG. 7, the surfaces of the silicon bonding pad elements 34 (and 32, not shown) are not exposed, by openings through the insulating material layer 26, prior to the application of the metal layer 50 to the workpiece. Thus, in this embodiment, the resulting bonding pads 56 each comprises a layer 30 of silicon, a layer 26 of insulating material, e.g., silicon dioxide, and a layer 50 of metal.

In this embodiment, the adherence of the metal layer 50 of the bonding pads 56 to the substrate 12 is also greatly increased in comparison with the prior art arrangement.

A further advantage of the invention is the simplicity of the use thereof. The various bonding pads 22, 23, 56, or the like, are provided in the same processes used to fabricate the other portions, e.g., the diodes and conductive strips of the device.

In a specific embodiment, the substrate 12 is of sapphire and has a thickness of 10 mils. The silicon layer 30 has a thickness of 15,000 A., and is doped with phosphorous to a concentration of $7\times10^{16}$ atoms/cm.$^3$. The P-doped portions 38 of the semiconductor diodes 16 are doped with boron to a concentration of $5\times10^{19}$ atoms/cm.$^3$. The silicon dioxide layer 26 has a thickness of 5,000 A. The metal layer 50 comprises aluminum having a thickness of about 15,000 A. The bonding pads 22 and 23 measure 3 by 3 mils.

In general, the invention has utility in the fabrication of devices using substrates of various dielectric materials, such as the aforementioned ones, to which semiconductor materials are well adherent.

We claim:

1. A semiconductor device comprising:

a substrate of a dielectric material, a semiconductor component comprising a first layer of a semiconductor material on and in epitaxial relation with said substrate, a bonding pad on said substrate, said pad comprising a second layer of said semiconductor material on and in epitaxial relation with said substrate, and a third layer of metal on said second layer, said first and second layers of said semiconductor material being discontinuous from one another, a wire bonded to the metal layer of said pad, and connector means electrically connecting said component to said pad.

2. A semiconductor device as in claim 1 wherein said connector means comprises a strip of metal integral with said bonding pad metal layer.

3. A semiconductor device as in claim 1 wherein said substrate is of sapphire, spinel, beryllium oxide, or zirconium oxide.

4. A semiconductor device as in claim 2 wherein said substrate is of sapphire, said metal is aluminum, and said semiconductor material is silicon.

5. A semiconductor device as in claim 1 wherein said semiconductor material is silicon, and said pad includes a fourth layer of silicon oxide intermediate said third and second layers.

6. A semiconductor device as in claim 5 wherein said connector means comprises a strip of metal integral with said bonding pad metal layer.

7. A semiconductor device as in claim 5 wherein said substrate is of sapphire, spinel, beryllium oxide or zirconium oxide.

8. A semiconductor device as in claim 6 wherein said substrate is of sapphire and said metal is aluminum.

* * * * *